United States Patent [19]
Doty

[11] Patent Number: 5,929,639
[45] Date of Patent: Jul. 27, 1999

[54] NON-DIPOLAR RF COIL FOR NMR LOCK AND HOMONUCLEAR DECOUPLING

[75] Inventor: F. David Doty, Columbia, S.C.

[73] Assignee: Doty Scientific Inc., Columbia, S.C.

[21] Appl. No.: 08/887,315

[22] Filed: Jul. 3, 1997

Related U.S. Application Data

[60] Provisional application No. 60/021,216, Jul. 3, 1996.
[51] Int. Cl.$^6$ .................................................. G01V 3/175
[52] U.S. Cl. ...................... 324/318; 324/322; 324/309; 324/313; 324/311; 600/422
[58] Field of Search .................... 324/318, 322, 324/309, 313, 311; 600/422

[56] References Cited

U.S. PATENT DOCUMENTS

| | | | |
|---|---|---|---|
| 3,569,823 | 3/1971 | Golay | 324/5 |
| 3,771,055 | 11/1973 | Anderson | 324/5 R |
| 4,051,429 | 9/1977 | Imanari | 324/5 A |
| 4,110,681 | 8/1978 | Hofer | 324/5 A |
| 4,398,149 | 8/1983 | Zens | 324/319 |
| 4,641,098 | 2/1987 | Doty | 324/322 |
| 4,646,024 | 2/1987 | Schenck | 324/318 |
| 5,162,739 | 11/1992 | Doty | 324/322 |
| 5,323,113 | 6/1994 | Cory | 324/318 |

OTHER PUBLICATIONS

D.M. Ginsberg and M.J. Melchner, Rev. Sci. *Instrum,* 41,122–123, (1970).

J. Friedrich and R. Freeman, "Spatial Localization Using a 'Straddle Coli'," *J. Magn. Reson.,* 77, 101–118, (1988).

G. J. Kost, S.E. Anderson, G. B. Matson, and C. B. Conboy, "A Cylindrical–Window NMR Probe with Extended Tuning Range for Studies of the Developing Heart," *J. Magn. Reson.,* 82, 238–252, (1989).

F. D. Doty, "Probe Design & Construction," *Encyclopedia of Nuclear Magnetic Resonance,* vol. 6, Wiley Press, (1996).

J. Hyde, "Surface & Other Local Coils for In Vivo Studies," *Encyclopedia of Nuclear Magnetic Resonance,* vol. 7, Wiley Press, (1996).

P. Broekaert, A. Vlassenbroek, J. Jeener, G. Lippens, and J.–M. Wieruszeski, "Observation and Selective Suppression of the Dipolar–Field Effects in 2D NMR in Liquids in Homogeneous Fields," *J. Magn. Reson. Ser.A,* 120, 97–104, (1996).

*Primary Examiner*—John Barlow
*Assistant Examiner*—Brij B. Shrivastav
*Attorney, Agent, or Firm*—Oppedahl & Larson LLP

[57] ABSTRACT

A single-tuned rf-gradient saddle coil is used for an internal NMR lock in a high-field NMR probe. The non-dipolar lock coil geometry is chosen such that its filling factor and Q are maximized subject to the constraint that its coupling coefficient to two orthogonal saddle coils is zero. Various quadrupolar and octopolar rf coils are disclosed for use in NMR probes having three or four sample coils for multinuclear triple resonance or homonuclear decoupling.

19 Claims, 6 Drawing Sheets

NON-DIPOLAR RF COIL FOR NMR LOCK AND HOMONUCLEAR DECOUPLING

This is a nonprovisional application claiming the benefit of copending provisional appl. No. 60/021,216, filed Jul. 3, 1996, which is incorporated herein by reference.

FIELD OF THE INVENTION

The field of this invention is the measurement of nuclear magnetic resonance (NMR) for the purpose of determining molecular structure, and, more particularly, an rf saddle coil for field lock having minimal mutual inductance with a second, aligned saddle coil tuned to a second frequency.

BACKGROUND OF THE INVENTION

This invention pertains to improving the efficiency and sensitivity of high-field high-resolution (HR) NMR techniques where an NMR lock signal for field stabilization is beneficial, especially for double-, triple-, and quad-resonance and for single-resonance quadrature techniques.

An rf lock channel tuned to a non-interfering nuclide, typically deuterium, has been routinely used to stabilize the magnetic field for at least three decades. See, for example, U.S. Pat. No. 4,110,681 by Hofer et al. Various aspects of NMR probe design are reviewed by Doty in "Probe Design and Construction" in *The Encyclopedia of Nuclear Magnetic Resonance,* Wiley Press, 1996.

Two basic lock approaches have been used—external and internal. In the external lock, an rf coil is wrapped around a separate, sealed capsule containing a lock sample, such as $D_2O$, and single-tuned to the lock frequency. For internal lock, a deuterated solvent is used for the sample solvent, and a second orthogonal coil is added around the sample coil, or one of the sample coils is multiply tuned to include the lock frequency. In most cases, an internal lock is preferred, as this provides improved field stability and may simplify field shimming.

A typical prior art internal-lock circuit (in which one saddle coil generating transverse $B_1$ is double-tuned to $^1H$ and $^2H$) is illustrated by Doty in FIG. 2 of U.S. Pat. No. 5,162,739. A second, orthogonal saddle coil may be used to generate a second transverse $B_2$ for another nuclide of interest. (Note that NMR saddle coils are often called "Helmholtz" coils as a carry-over from probes for iron-core magnets, although homogeneous saddle coils are more properly called "Ginsberg" coils.) This approach generally works very well for single-resonance and double-resonance NMR, as it is usually possible to achieve over 70% efficiency on the one or two nuclides (e.g., $^1H$, $^{13}C$) of main interest at the expense of obtaining 10% to 20% efficiency on the lock channel, which is usually quite sufficient. All prior-art lock coils for use in HR NMR, whether internal or external, are dipolar and have substantially homogeneous transverse rf magnetic field throughout the sample.

The deficiencies of the prior art become pronounced in multi-nuclear (broad-band tunable) triple-resonance NMR where high-efficiency is needed at three frequencies simultaneously. For multi-nuclear observations at high field, and especially with larger samples where balancing is required, it becomes very difficult to achieve efficiency above 50% in a double-tuned coil at one multi-nuclear resonance even when the other resonance (of the same coil) is permitted to have very low efficiency. Moreover, it is virtually impossible (always impractical) for the multi-nuclear range of a double-tuned coil to include $^{31}P$ and $^{15}N$ when the other resonance of this coil is tuned to $^2H$, as deuterium lies within the range needed for the multinuclear channel.

A substantial simplification in tuning and perhaps a factor of two improvement in efficiency on one of the channels could be obtained if internal $^2H$ lock or homonuclear decoupling could be accomplished on a third coil having zero mutual inductance and balanced electric coupling with the other two orthogonal rf saddle coils. The obvious candidate, a solenoid aligned with the $B_0$ axis, is not suitable, as its rf magnetic field $B_3$ is predominately aligned with the $B_0$ axis and is thus not capable of driving the NMR resonance. The approach taken by Anderson in U.S. Pat. No. 3,771,055 to achieve three orthogonal rf-decoupled fields works only in the transverse field geometry of the obsolete electromagnet.

Homo-nuclear decoupling, in which the sample is irradiated at the same frequency and simultaneous with signal reception, has found a few applications over the past three decades, and a recently described technique for suppression of satellites from bulk dipolar effects in concentrated liquid samples in high field 2D-NMR is likely to make homo-nuclear proton decoupling extremely important in future biomolecular NMR applications. (See P. Broekaert et al in *J. Magn. Reson. Ser. A,* 1996, 119, pp. 115–119.) A single-coil pulse-train technique in which the sampling occurs during windows between the pulses has been shown to be effective for some situations, but a cw technique is likely to be more effective for many applications. The problem with homo-nuclear cw decoupling is isolation between the transmitter and the receiver—a problem that was more widely appreciated before the advent of FT-NMR.

The traditional approach to cw homonuclear decoupling has been the use of two orthogonal, precisely balanced dipolar coils tuned to the proton resonance, but this approach does not work well in double- or triple-resonance multi-nuclear NMR as the balance requirements are extremely critical—isolation better than 40 dB is desired for two coils tuned to the same frequency.

Phased-arrays for NMR reception at a single frequency were disclosed by Carlson in U.S. Pat. No. 4,857,846 and later by others. A relatively large number of coils, each capable of generating $B_1$ that is transverse to $B_0$, are independently tuned to the same frequency and the signals are added with the proper phase. The tuning is simplified (and localized signal to noise may be improved) when the adjacent coils have zero mutual inductance. Various coil arrangements have been used that meet the requirements of efficiently generating substantial transverse rf magnetic field throughout a portion of the sample and having zero mutual inductance with adjacent, aligned coils. An excellent review is provided by James Hyde in 'Surface Coils and Other Local Coils for In Vivo Studies', in *The Encyclopedia of Nuclear Magnetic Resonance,* Wiley Press, 1996.

One requirement of coils suitable for phased arrays and low mutual inductance is that their fields must be highly non-uniform, which is completely contrary to the requirements of most HR NMR rf coils. Not surprisingly, phased arrays have not been used in HR NMR spectroscopy, although homo-nuclear rf gradient coils, as disclosed by Cory et al in U.S. Pat. No. 5,323,113, have found some applications in coherence selection, rf imaging, and solvent suppression.

Since very small magnetization nutations are effective in a lock circuit, the benefits of an internal lock are not compromised by the use of a highly non-uniform rf lock field. Thus, it is possible to design an independent lock coil that is magnetically orthogonal to two mutually orthogonal uniform rf fields but still generates substantial transverse magnetization within the sample.

With the inventive lock coils, a double-tuned multi-nuclear rf coil may be replaced by a single-tuned multi-nuclear rf coil and a separate, rf-decoupled lock coil. The rf efficiency of the multi-nuclear channel is then substantially improved—often by a factor exceeding 70%.

The various $B_0$ shim and gradient coils described by Golay and Rumson in U.S. Pat. No. 3,569,823, Schenck et al in U.S. Pat. No. 4,646,024, and others are designed to produce orthogonal gradients in $B_Z$, but they also generate orthogonal gradients in a transverse field ($B_X$ or $B_Y$), although modifications could improve efficiency for transverse fields.

The homo-nuclear switchable coil used by Cory et al is capable of being switched from a homogeneous Ginsberg coil to a gradient Ginsberg coil, as described by Ginsberg and Melchner in *Rev. Sci. Instrum.*, 41, pp. 122–123, 1970 and later by J. Friedrich and R. Freeman in *J. Magn. Reson.* 77, pp. 101–118, 1988. This is predominately a $dB_x/dx$–$dB_y/dy$ coil and this gradient field is mathematically orthogonal to the transverse dipolar rf field when integrated over the sample region, as required for coherence rejection when the coil configuration is switched between excitation and reception. The two configurations are also orthogonal when integrated over all space and hence have zero mutual inductance, although the rf filling factor of this gradient coil is rather low. It should be noted that Friedrich and Freeman use the rf gradient coil for pre-saturation to permit localized spectroscopy using one half of the coil following the pre-saturation sequence. Cory's invention may be thought of as imparting a phase dependence to specific coherences throughout the sample in such a way that their signals average to zero when received by an orthogonal coil.

Various fields and coils are often described loosely as being orthogonal, but in most real cases the orthogonality condition (the integral of the product of the functions over a given region is zero) applies only over a very limited region of space—typically the sample region, or a fraction thereof, for NMR shim coils. When two coils are mathematically orthogonal over all space, they have zero mutual inductance $L_M$. Expressed otherwise, their inductive coupling coefficient k is zero, which is defined by the following:

$$L_M = k\sqrt{(L_1 L_2)}$$

where $L_1$ and $L_2$ are the self inductances of the respective coils. "Orthogonal" shim coils may have coupling coefficients above 0.4, as they are normally used only for DC field corrections in the sample space, while MRI gradient coils generally have coupling coefficients below 0.02.

The main differences between conventional shim or gradient coils and the inventive non-dipolar rf coils in optimization criteria are (1) the rf coil inductance should be about three orders of magnitude lower, (2) the filling factor and Q of the rf coil should be maximized, (3) no particular functional dependence of the field profile in the sample region is required, and (4) the orthogonality integration must extend over all space rather than just the sample region to achieve zero mutual inductance.

SUMMARY OF THE INVENTION

A single-tuned rf-gradient saddle coil is used for an internal NMR lock in a high-field NMR probe. The quadrupolar or octopolar lock coil geometry is chosen such that its filling factor and Q are maximized subject to the constraint that its coupling coefficient to two orthogonal dipolar saddle coils is zero. An octopolar rf coil may also be used for homo-nuclear proton decoupling.

DETAILED DESCRIPTION OF THE PREFERRED EMBODIMENTS

Figure 1A:
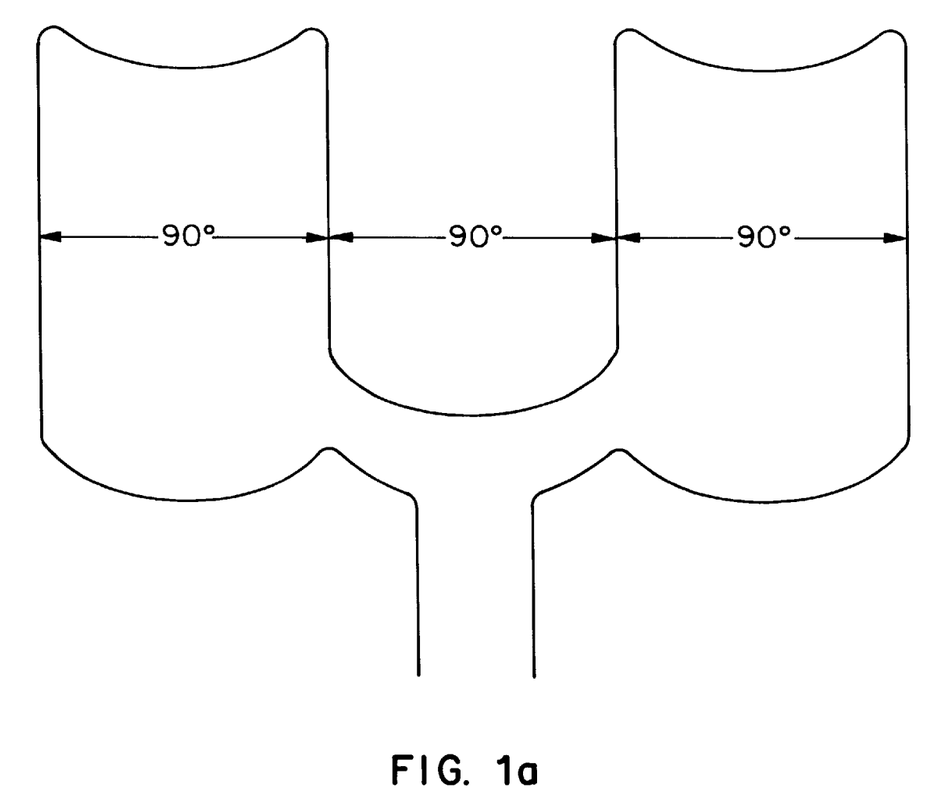
FIG. 1*a* schematically depicts a $z_0$-quadrupolar, or $dB_Y/dx$–$dB_Y/dy$, lock coil laid out flat.
Figure 1B:
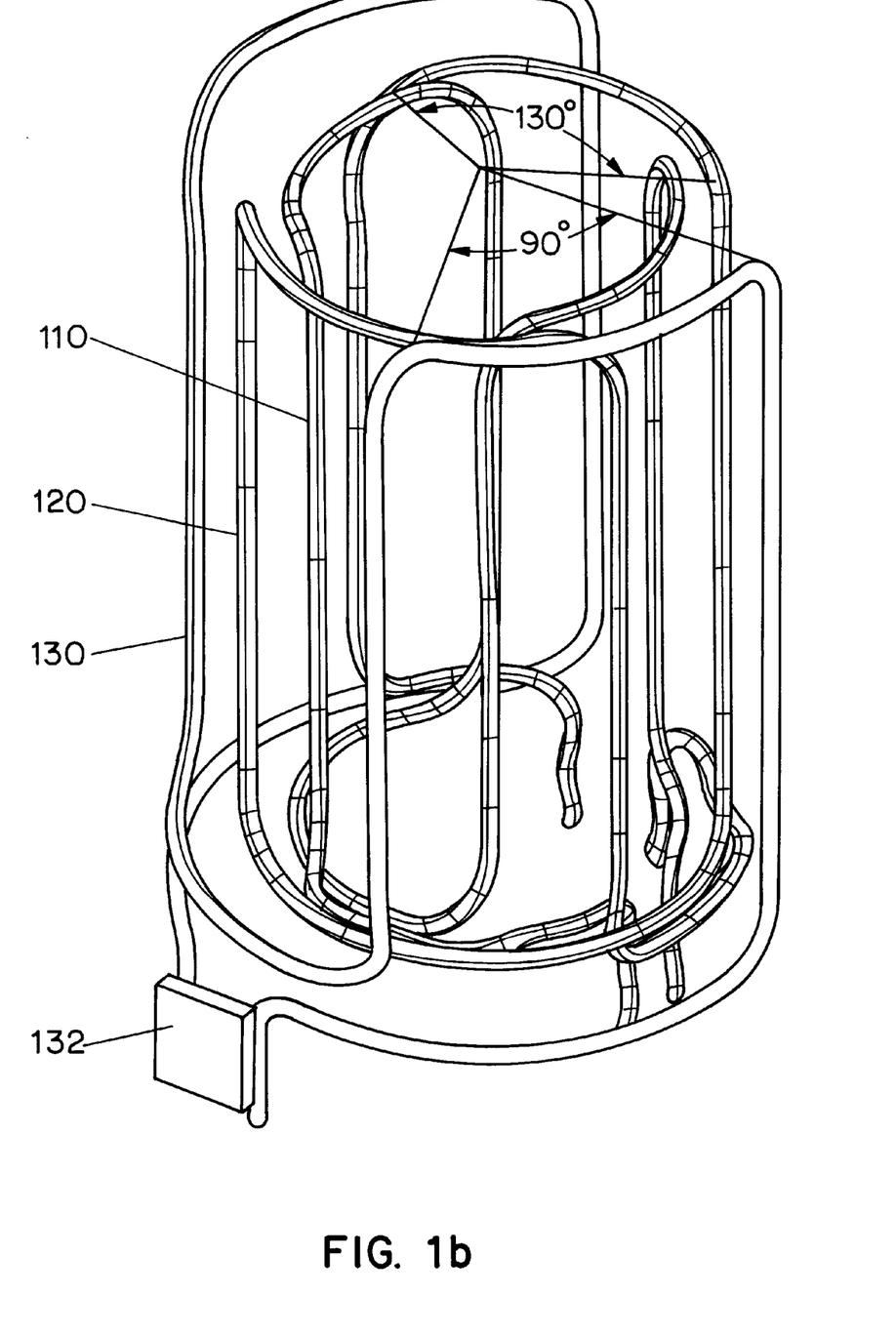
FIG. 1*b* is a 3-D rendering of this lock coil outside two conventional dipolar Ginsberg (saddle) coils.

Referring now to FIGS. 1*a* and 1*b*, which are similar to FIG. 8 of U.S. Pat. No. 5,323,113, we see two typical dipolar observe coils 110, 120 inside the inventive $z_0$-quadrupolar (or, anti-Ginsberg) series-2-turn lock coil 130. The distinctions from the prior art lie primarily in the distinct tuning frequencies and the intended use, which is both novel and non-obvious. Clearly, other dipolar homogeneous observe coil geometries may also be chosen for the observe coils, and several other possibilities are shown later in FIGS. 2 and 3. It should be noted that virtually all NMR volume observe coils (whether linear or circular) and at least 95% of NMR surface coils have been dipolar—that is, they generate a predominantly dipolar $B_1$ field.

The inventive non-dipolar deuterium lock coil would always be the outermost coil, as lock sensitivity is not critical. In many cases, either the inner or the middle dipolar coil would be used to irradiate and thereby alter the effects of nuclear couplings (usually of protons) rather than to observe NMR signals and would commonly be called a "decoupling coil", although it could also be used for NMR detection and hence will be referred to herein as an "observe" coil. Either or both of these mutually orthogonal "observe" coils may be multiply tuned using conventional methods for additional nuclides. For large samples at high field, a single observe coil with circular polarization or two orthogonal observe coils tuned to the same frequency may be preferred for quadrature reception.

With minor 'tweaking', inductive coupling coefficients below 0.01 are routinely achieved for concentric observe coils rotated 90° with respect to each other, which permits adequate isolation (in excess of 18 dB) for typical high-Q circuits with a frequency separation of 5%. For a frequency difference of 10%, the isolation is a more comfortable 30 dB. Aligned homogeneous coils, on the other hand, may have a coupling coefficient of 0.5 to 0.9 (depending primarily on the ratio of their diameters), which results in significant signal loss and tuning difficulties even when the frequencies differ by a factor of two to four. Rotating the conventional dipolar lock coil 90° about the axis does not work when two orthogonal observe coils are used.

The basic coil units of saddle coils are often referred to as Golay loops, which are characterized by a mean subtended angle, an axial length, an azimuthal center location, and an axial center location. Ginsberg, Hoult, and others showed that the optimum subtended angle for the Golay loops in the 2-loop observe coils 110, 120 is 120° for fine wire and small-diameter samples with length equal to twice the coil diameter, but numerical optimization shows that the optimum subtended angle is often more than 130° for heavy wire and larger, shorter samples, depending mostly on the wire size and relative sample length.

The optimum subtended angle of the symmetrically positioned Golay loops in the $z_0$-quadrupolar coil 130 is approximately 90°, with length approximately equal to the mean length of the aligned observe coil. Because of its symmetry, an inductive coupling coefficient less than 0.05 to any dipolar homogeneous observe coil (linear or circular polarization) 110, 120 is readily obtained without numerical optimization, and the coil works well for any azimuthal orientation. A surprising feature is than the inductance of the series-2-turn $z_0$-quadrupolar coil is typically only 10% to 30% less than the inductance of the shielded parallel-2-turn homogeneous coil (see FIG. 2) of comparable size. Note that the transverse field from the $z_0$-quadrupolar lock coil 130 is zero along the axis of the sample (the contributions from the two loops cancel), and the coil generates a $dB_y/dx-dB_x/dy$ gradient throughout most of the sample, as previously noted by Cory.

Filling factor $\eta_F$ (conventionally defined as the magnetic energy in the transverse component throughout the sample region divided by the total magnetic energy throughout all space) for the $z_0$-quadrupolar coil is less than 25% of what a comparable homogeneous coil would achieve, but the single-tuned circuit will have nearly 100% efficiency, making its NMR sensitivity comparable to that of the lock channel in a conventional double-tuned coil. The rf magnetic energy within the sample from the x-component is approximately equal to the magnetic energy from the y-component for the $z_0$-quadrupolar coil. Because of the relatively large energy concentration around wires and leads in a gradient coil, it helps to use the largest wire diameter that is practical (10–15% of the coil diameter) for the lock coil. This increases both rf Q and filling factor. To avoid spoiling the homogeneity of the external magnetic field $B_0$ from the large conductors, it is generally desirable to use precision paramagnetic wire (such as aluminum) inside precision copper tubing for magnetic compensation.

All commercial lock circuits are tuned to deuterium, which has a rather low magnetogyric ratio, resonating at 76.7 MHz in an 11.7 Tesla field, for example. For samples larger than 25 mm at high field, improved isolation may be obtained by using an anti-parallel configuration, rather than the anti-series configuration as shown, for the two loops on the quadrupolar coil to reduce the inductance and the effects of electric coupling, even though the coil may be operating at less than 10% of its self-resonant frequency. Because the coil is single-tuned to a fixed frequency, the fixed capacitor 132 positioned close to the coil across the leads may tune the coil very close to the desired frequency and thereby make the lead losses normally associated with a very low inductance negligible.

An ultra-low-inductance magnetically compensated non-dipolar lock coil may be positioned extremely close to the outer observe coil without impairing rf isolation or $B_0$ homogeneity. However, high voltage pulses on the observe coil will generally require radial spacing greater than a millimeter.

Figure 2A:
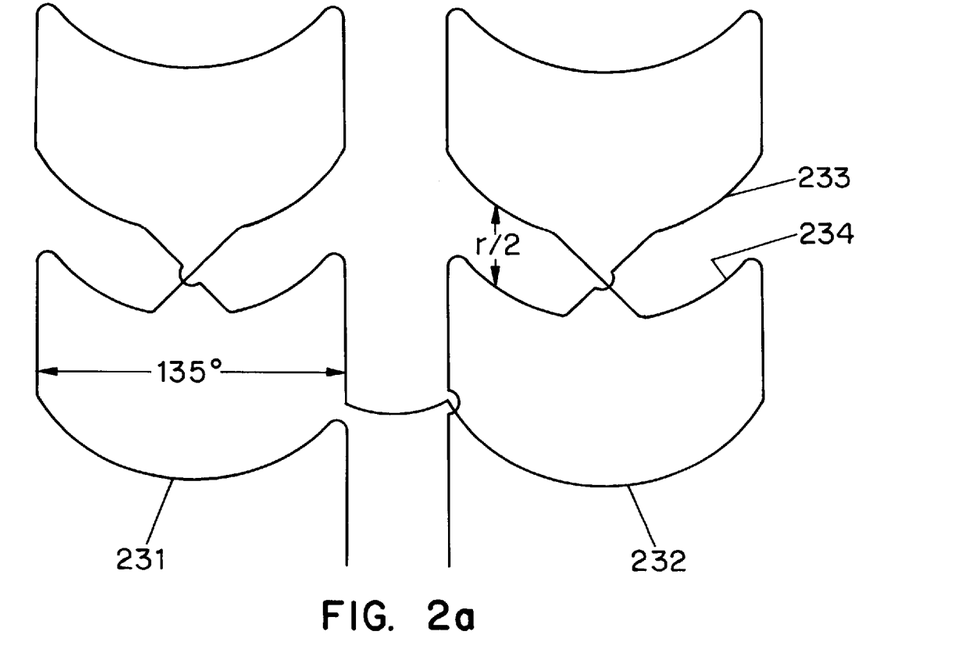
FIG. 2*a* schematically depicts an x-quadrupolar, or $dB_Y/dz$, lock coil laid out flat.
Figure 2B:
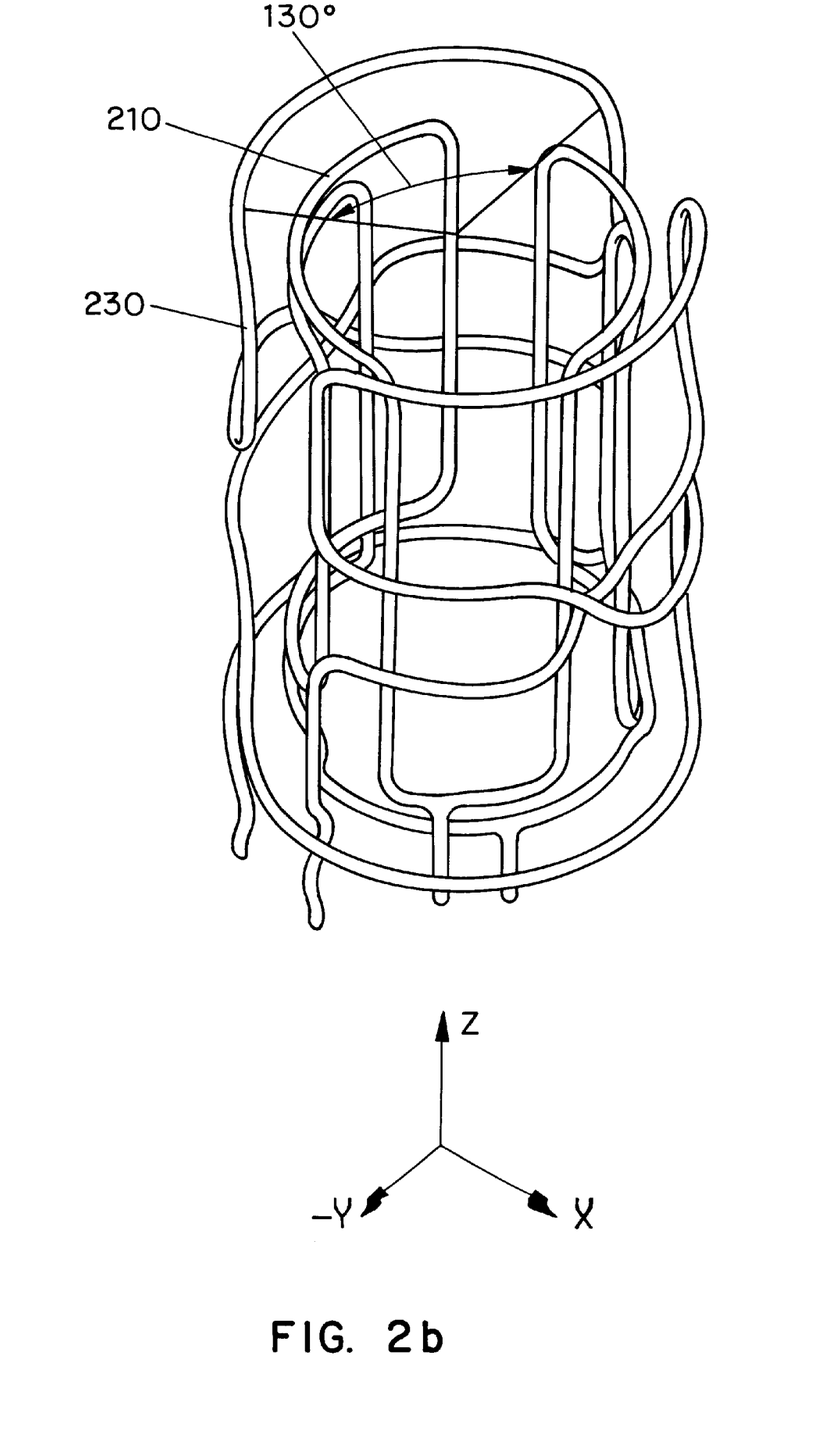
FIG. 2*b* is a 3-D rendering of this lock coil outside a parallel-2-turn $B_Y$ saddle coil, which is schematically depicted in FIG. 2*c* laid out flat.
Figure 2C:
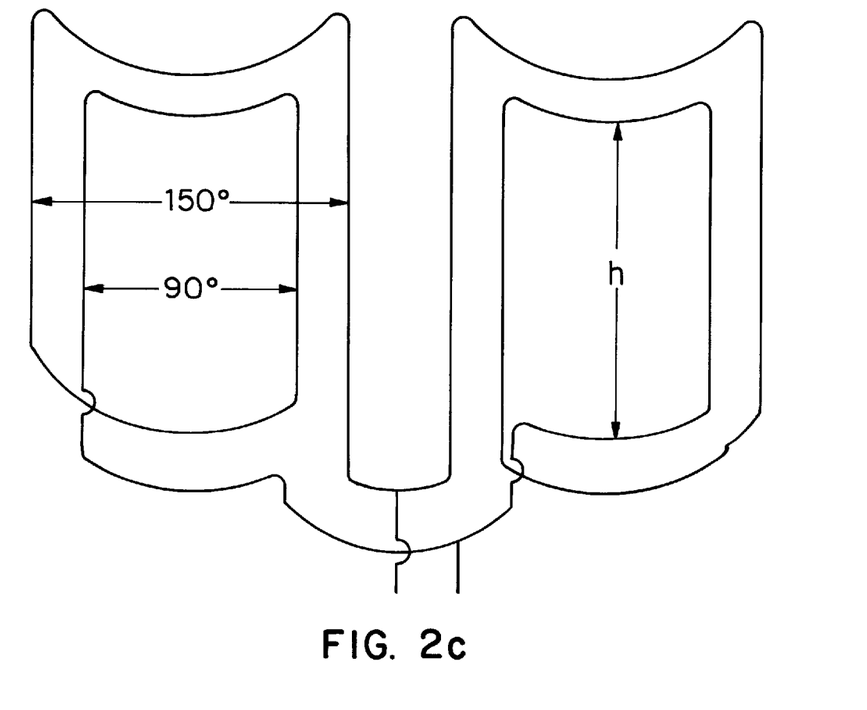

FIGS. 2a and 2b show a better rf-decoupled lock coil geometry for most applications. The x-quadrupolar, or $dB_y/dz$, coil 230 is shown outside a modern observe coil 210. The x-quad-rupolar lock coil 230 is similar in field profile to that shown in FIG. 7 of U.S. Pat. No. 5,323,113. FIG. 2c helps to clarify the parallel-2-turn dipolar observe coil 210 (previously unpublished, but public domain), which permits twice the $B_1$ homogeneity of the series-2-turn saddle coil shown in FIG. 1b (as described by Ginsberg, Hoult, Zens, etc.). The optimum mean subtended angles in the inner and outer Golay loops in this observe coil 210 are typically 90° and 150° respectively. A second NMR dipolar observe coil, similar to coil 210 except at a slightly different diameter and rotated 90° about the z-axis, is also assumed present but not shown for graphic clarity.

The x-quadrupolar coil 230 is shown formed from a series pair of figure-8 coils 231, 232 but a parallel pair of figure-8 coils may also be used to produce a magnetic field that is quadrupolar when viewed along the x axis. The optimum subtended angle in the four Golay loops is typically 130–140° for the x-quadrupolar coil. Optimum overall length is typically about 5% to 40% greater than the window height h of the aligned observe coil 210, depending largely on the type and dimensions of the aligned observe coil. Optimum axial spacing between central arcs 233, 234 is typically half the coil radius. For long samples, filling factor is about twice that of the $z_0$-quadrupolar coil, although inductance of the x-quadrupolar coil is about 50% more. The x-quadrupolar coil also easily achieves coupling coefficient less than 0.05 to any transverse homogeneous coil without numerical optimization. However, if very short samples are used (perhaps with susceptibility-matched plugs, as described in a co-pending application), the x-quadrupolar coil may have insufficient lock sensitivity, as its transverse field vanishes along the z=0 plane.

Figure 3A:
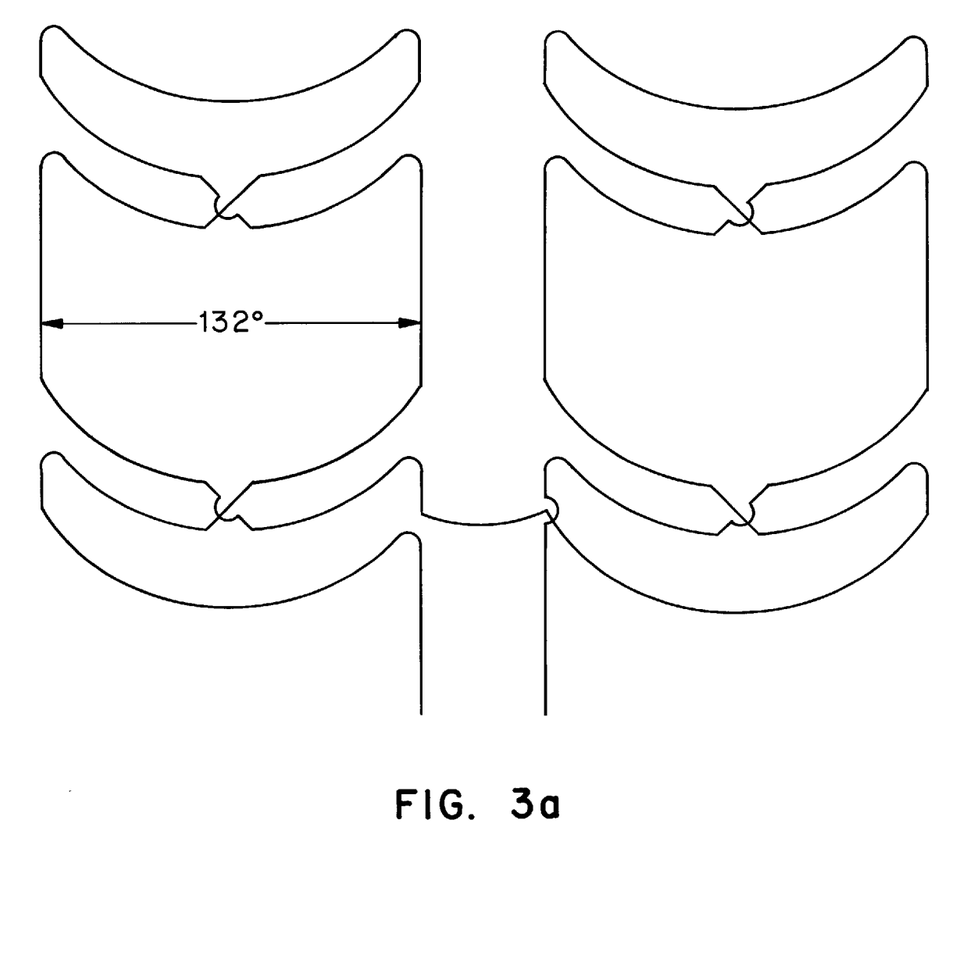
FIG. 3*a* schematically depicts an x-octopolar, or $dB_Y/dz^2$, coil laid out flat.
Figure 3B:
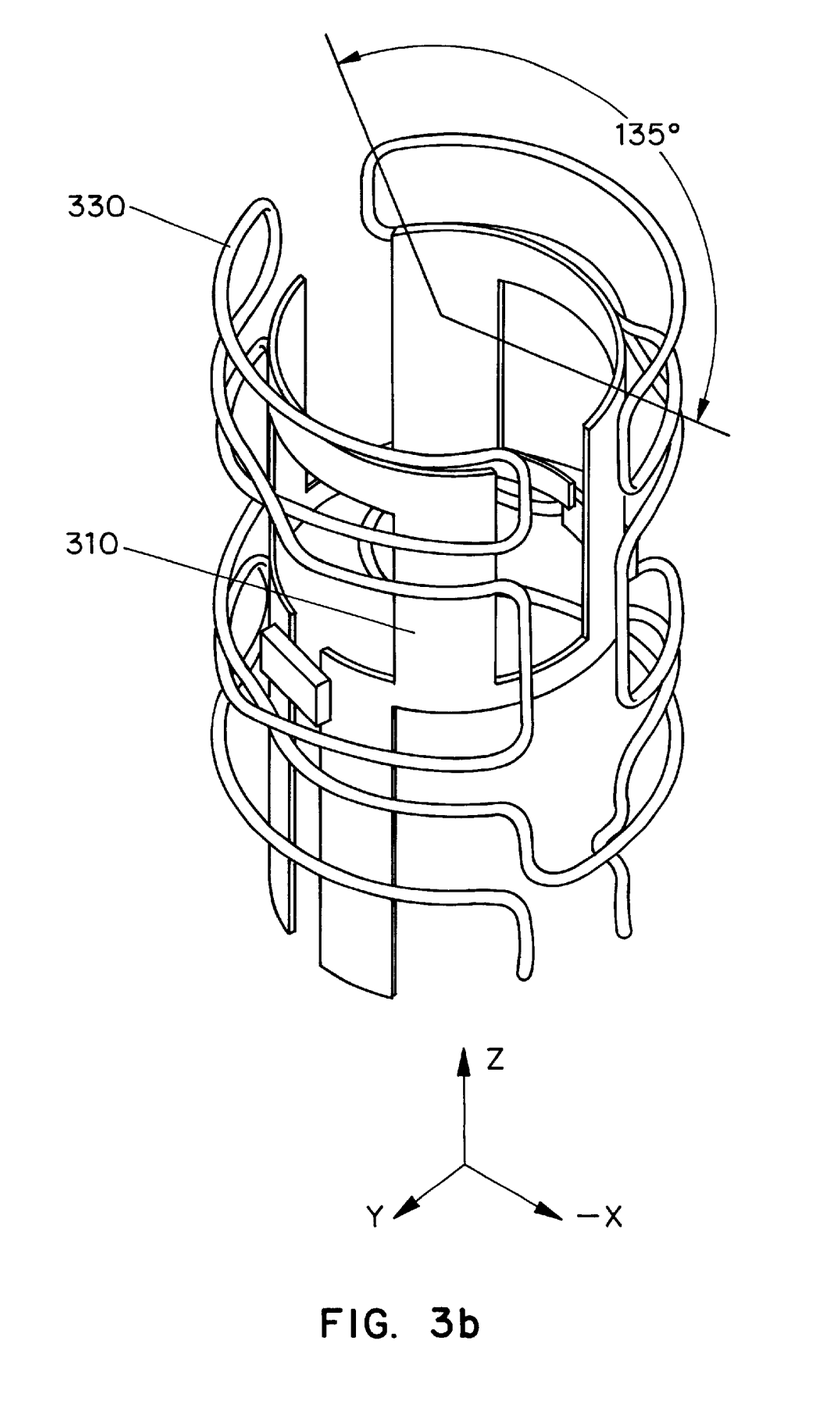
FIG. 3*b* is a 3-D rendering of this homo-nuclear decoupling coil outside a transparent $B_Y$ slotted resonator.

The $dB_y/dz^2$ octopolar coil 330 shown in FIGS. 3a and 3b may also achieve coupling coefficient less than 0.05 to an aligned transverse homogeneous coil when the arcs are properly positioned. (Note that the field actually has only six distinguishable poles, but the middle two poles are of about twice the strength of the outer four poles. The field is essentially that of two quadrupoles displaced and rotated with respect to each other.) A transparent slotted resonator 310, as disclosed in U.S. Pat. No. 4,641,098, is illustrated for generating uniform rf magnetic field $B_1$ along the y axis throughout the sample region for an observe nuclide. Again, an orthogonal observe coil is assumed present but not shown, and other observe coil geometries as described in a co-pending application, may be preferred. Optimum subtended angle for the Golay loops in the octopolar coil 330 is generally about 132°, but the relative axial locations of the arcs depend rather strongly on the details of the homogeneous coil and the locations of the internal and external rf shields, thereby requiring detailed numerical optimization for the specific observe coils. The $dB_y/dz^2$ coil generally has slightly better filling factor than the $z_0$-quadrupolar coil for full-length samples, but its sensitivity is twice as good for very short samples, although its inductance is about twice as high. The transverse field of the octopolar lock coil vanishes on two planes symmetrically spaced above and below the origin. These planes lie within the sensitive region of the observe coils, although a short sample may not extend this far. Hence, the octopolar coil is not mathematically orthogonal to the observe coil over the sample region and is not suitable for the types of experiments described by Cory, although its coupling coefficient may still be zero.

The x-quadrupolar coil may be rotated 90° about the z-axis, becoming a y-quadrupolar coil. Likewise, the x-octopolar lock coil may be rotated 90° about the z-axis, becoming a y-octopolar coil. These 90° rotations result in coils that have essentially zero coupling coefficients to the original. Also, a rotation of approximately 45° (exactly 45° for the infinitely long coil) of the $z_0$-quadrupolar coil about the z axis results in a field orthogonal to the original field, which may be called the $z_1$-quadrupolar coil. The geometries described above, along with the orthogonal dipolar coils, permit eight NMR coils generating transverse magnetization throughout a single sample region with zero inductive coupling coefficients to each other. Only the two dipolar coils have high rf homogeneity throughout the full sample region, although the octopolar coils have good homogeneity for a short sample in the center. Additional orthogonal geometries based on the higher-order gradient coils as described by Golay are possible, but they have much lower filling factor and Q.

Note that all of the above quadrupolar fields are substantially orthogonal to a dipolar field over any length of cylindrical sample and are thus suitable for rf-gradient coherence selection as well as for rf-decoupled lock coils.

In addition to NMR lock, the availability of multiple, isolated NMR sample coils allows improvements in homonuclear decoupling, especially in double- or triple-resonance circuits. A dipolar coil 310 may be used for the proton observe coil with the x-octopolar gradient coil 330 of FIG. 3 for the proton transmitter coil along with a short sample restricted to the central region of uniform $B_3$ using susceptibility-matched plugs. Even though isolation is more difficult to achieve with the octopolar coil than with the quadrupolar coils, very high isolation may still be achieved for fixed-frequency tuning using trimmer capacitors, as it is not necessary for the inductive coupling coefficient to be extremely close to zero when a residual inductive coupling may be canceled by an adjustable electic-field coupling, which may be conveniently accomplished for fixed tuning frequencies. The low filling factor of an outer-most octopolar coil is immaterial for the intended homo-nuclear proton decoupling applications, as transverse rf field strengths of approximately 0.01 mT are sufficient.

A second non-dipolar coil may still be used for an rf-decoupled lock coil, and another orthogonal dipolar coil may be used for double or triple resonance. With the above homo-nuclear decoupling coil, five options are available for the lock coil: the y-octopolar coil, the x-quadrupolar coil, the y-quadrupolar coil, the $z_0$-quadrupolar coil, and the $z_1$-quadrupolar coil. A probe with four concentric coils (two dipolar and two of higher order) is expected to have numerous applications in high-field NMR of liquid samples.

Although this invention has been described herein with reference to specific embodiments, it will be recognized that changes and modifications may be made without departing from the spirit of the present invention. All such modifications and changes are intended to be included within the scope of the following claims.

I claim:

1. An NMR probe with internal lock for use in an axially aligned magnetic field $B_0$, said probe comprising
   a first dipolar observe coil concentric with the z-axis capable of generating substantially uniform transverse $B_1$ within a homogeneous sample region,
   a second dipolar observe coil concentric with the z-axis capable of generating substantially uniform transverse $B_2$ within said sample region such that said $B_1$ and said $B_2$ are substantially orthogonal,
   a non-dipolar lock coil,
   capacitive means for tuning said coils,
   support means for centering said coils with respect to said sample region,
   said lock coil further characterized as generating transverse magnetic field $B_3(r)$ within said sample region and having inductive coupling coefficient less than 0.2 to either of said observe coils.

2. The probe of 1 wherein said lock coil is quadrupolar with respect to the z axis.

3. The probe of 1 wherein said lock coil is quadrupolar with respect to a transverse axis.

4. The probe of 1 wherein said lock coil is octopolar with respect to a transverse axis.

5. The probe of 1 wherein said lock coil is tuned to the resonance of deuterium in said $B_0$.

6. The probe of 1 further characterized as including an octopolar proton decoupling coil.

7. The probe of 1 wherein said $B_3(r)$ is zero for a locus of points within said sample region.

8. The probe of 2 wherein said $B_3(r)$ has the following approximate functional dependence within a substantial portion of said sample region: $dB_3(r)/dx - dB_3(r)/dy = C$, where C is a constant.

9. The probe of 3 wherein said $B_3(r)$ has the following approximate functional dependence within a substantial portion of said sample region: $dB_3(r)/dz = C$, where C is a constant.

10. The probe of 4 wherein said $B_3(r)$ has the following approximate functional dependence within a substantial portion of said sample region: $B_3(r) = A - Dz^2$, where A and D are constants.

11. The probe of 1 wherein said lock coil is further characterized as comprising paramagnetic wire inside copper tubing.

12. The probe of 1 wherein said coupling coefficient is less than 0.05.

13. The probe of 1 wherein said first and said second observe coils are tuned to the same frequency.

14. The probe of 1 wherein the mean diameter of said lock coil is greater than the mean diameter of either of said observe coils.

15. The probe of 8 wherein said lock coil is further characterized as comprising two Golay loops symmetrically located on a transverse axis and having subtended angles of 90°.

16. The probe of 9 wherein said lock coil is further characterized as comprising four Golay loops symmetrically positioned with respect to the origin, with centers on a plane that includes the z-axis, and having subtended angles of 135°.

17. The probe of 10 wherein said lock coil is further characterized as comprising six Golay loops symmetrically positioned with respect to the origin, with centers on a plane that includes the z-axis, and having subtended angles of 132°.

18. The probe of 11 in which the outside diameter of said copper tubing is approximately 12% of the diameter of said sample region.

19. An NMR probe with internal lock for use in an axially aligned magnetic field $B_0$, said probe comprising
   a quadrature dipolar observe coil concentric with the z-axis capable of generating substantially uniform transverse circular polarization $B_1$ within a homogeneous sample region,
   a non-dipolar lock coil,
   capacitive means for tuning said coils,
   support means for centering said coils with respect to said sample region,
   said lock coil further characterized as generating transverse magnetic field $B_3(r)$ within said sample region and having inductive coupling coefficient less than 0.2 to any mode of said observe coil.

* * * * *